United States Patent
Dore et al.

(10) Patent No.: US 8,214,723 B2
(45) Date of Patent: Jul. 3, 2012

(54) FAST ENCODING AND DECODING METHODS AND RELATED DEVICES

(75) Inventors: Jean-Baptiste Dore, Issy les Moulineaux (FR); Marie-Hélène Hamon, Issy les Moulineaux (FR); Pierre Penard, Issy les Moulineaux (FR)

(73) Assignee: France Telecom, Paris (FR)

( * ) Notice: Subject to any disclaimer, the term of this patent is extended or adjusted under 35 U.S.C. 154(b) by 515 days.

(21) Appl. No.: 12/223,109

(22) PCT Filed: Jan. 18, 2007

(86) PCT No.: PCT/FR2007/050664
§ 371 (c)(1),
(2), (4) Date: Oct. 1, 2009

(87) PCT Pub. No.: WO2007/083066
PCT Pub. Date: Jul. 26, 2007

(65) Prior Publication Data
US 2010/0287437 A1 Nov. 11, 2010

(30) Foreign Application Priority Data
Jan. 19, 2006 (FR) ..................... 06 50196

(51) Int. Cl.
*H03M 13/00* (2006.01)
(52) U.S. Cl. ...................... 714/776; 714/801
(58) Field of Classification Search ............. 714/801, 714/776
See application file for complete search history.

(56) References Cited

U.S. PATENT DOCUMENTS

| | | | |
|---|---|---|---|
| 6,665,833 B1 * | 12/2003 | Tong et al. | 714/790 |
| 7,020,824 B2 * | 3/2006 | Tanaka et al. | 714/755 |
| 7,095,698 B2 * | 8/2006 | Uchida | 369/59.24 |
| 7,480,851 B2 * | 1/2009 | Chang et al. | 714/792 |

(Continued)

FOREIGN PATENT DOCUMENTS

WO WO 99/34521 7/1999

OTHER PUBLICATIONS

Y. Wang et al., "Reduced latency turbo decoding", 6$^{th}$ Workshop on Signal Processing Advances in Wireless Communications, 2005 New York, NY, pp. 930-934, Jun. 2, 2005.
K.M. Chugg et al., "A New Class of Turbo-like Codes with Universally Good Performance and High-Speed Decoding", Military Communications Conference, MILCOM 2005, pp. 1-10, Oct. 17, 2007.

*Primary Examiner* — M. Mujtaba K. Chaudry
(74) *Attorney, Agent, or Firm* — Cozen O'Connor

(57) ABSTRACT

A method of low latency encoding of an input bit sequence (S0) to yield an encoded bit sequence (S), and a corresponding decoding method, said encoding method including: a first encoding step (E1) applied to bits of the input bit sequence (S0), using a first code; an interleaving step (E3) in which an interleaver interleaves the bits obtained from said first code; and a parity, second encoding step (E4) applied to the bits obtained from said interleaver, using a second code, to generate said encoded bit sequence (S). The parity, second encoding step (E4) starts after a predetermined number $\Delta$ of bits have been interleaved, said predetermined number $\Delta$ of bits ranging between a first lower number $\Delta i$ of bits depending on one or more parameters of said interleaving step (E3) and a first higher number $\Delta s$ of bits corresponding to the total number of bits to be processed during said interleaving step (E3).

30 Claims, 5 Drawing Sheets

U.S. PATENT DOCUMENTS

2003/0005388 A1* 1/2003 Fukumasa ................ 714/786
2003/0043749 A1* 3/2003 Tanaka et al. ............ 370/241
2005/0053168 A1* 3/2005 Song et al. ............... 375/261
2005/0149842 A1* 7/2005 Kyung et al. ............. 714/800

* cited by examiner

FAST ENCODING AND DECODING METHODS AND RELATED DEVICES

RELATED APPLICATIONS

This is a U.S. National Phase Application under 35 USC 371 of International Application PCT/FR2007/050664, filed on Jan. 18, 2007.

This application claims the priority of French application no. 06/50196 filed on Jan. 19, 2006, and the content of which is hereby incorporated by reference.

TECHNICAL FIELD OF THE INVENTION

The invention relates to the field of digital communications and is more particularly concerned with a high bit rate encoding and decoding method using an LDPC (low density parity check) code, for example, and associated encoding and decoding devices.

BACKGROUND OF THE INVENTION

At present, the highest performing digital communications systems are based on systems in which data to be transmitted is protected by very high performance channel coding and is decoded iteratively by a weighted output decoder. Channel coding or error corrector coding improves transmission quality by inserting redundant bits into the message to be transmitted in accordance with a given law.

In the field of digital transmission, and especially when the transmission channel is a radio channel, the principal function of these corrector codes is to eliminate ambiguities in the transmitted message caused by the transmission channel. The channel decoder, which knows the coding law used on transmission, verifies if that law is still complied with on reception. If not, it detects that transmission errors are present.

The performance improvement achieved by these codes can be used to reduce the power consumption of terminals or to increase the volume of information transmitted.

Recently, considerable research has been conducted into channel coding using LDPC (low density parity check) error corrector codes.

These codes are now being promulgated by standardization bodies, for example, in the context of standardizing the IEEE 802.11n communications protocol intended for future wireless access networks (WLAN) operating at very high bit rates and the IEEE 802.16e (WiMAX Mobile) protocol.

The document US 2005 0216819 describes a method and a device for encoding and decoding serial turbo-like codes generated by the serial concatenation of external coding, interleaving, parity coding, and internal coding.

The document "A New Class of Turbo-like Codes with Universally Good Performance and High-Speed Decoding" (IEEE Milcom 2005, October 2005), Keith M. Chugg et al., describes a new class of codes known as S-SCP (systematic and serial concatenated parity) codes and in particular F-LDPC (flexible LDPC) codes for which the parity check matrix H can be written in the following form:

$$H \equiv \begin{pmatrix} S & V & 0 \\ 0 & I & G \end{pmatrix} \quad (1)$$

where I is an identity matrix, G and S are bidiagonal matrices, and V is the product of three matrices according to the IEEE 802.11-04/0953r4 standardization document, K. Chugg et al. (802.11 Task Group N, September 2004). The form of this matrix V imposes a limitation on the encoding and decoding bit rate.

FIGS. 1A and 1B respectively represent the structure of a prior art encoder 10 and a prior art decoder 20. In FIG. 1A, the encoder 10 comprises an external coder 3, an interleaver 5, a serial-parallel converter 7, a parity coder 9, and an internal coder 11. The code generated by this encoder 10 is the result of the serial concatenation of codes successively generated by the external coder 3, the parity coder 9, and the internal coder 11.

According to that architecture, an input bit sequence De is first entirely coded by the external coder 3 and then interleaved by the interleaver 5 to form an interleaved data sequence Di. The serial-parallel converter 7 parallelizes the interleaved data sequence Di. The parity coder 9 then performs a parity calculation by effecting the modulo-2 sum of J bits extracted from the output of the serial-parallel converter 7. The data sequence at the output of the parity coder 9 is then coded by the internal coder 11.

The structure of a decoder 20 comprising an external decoder 15, an interleaver/de-interleaver 17, a parity decoder 19, and an internal decoder 21 is shown in FIG. 1B.

The decoder 20 decodes flexible data iteratively. The flexible data corresponding to the systematic portion of the code is used by the external decoder 15 to obtain extrinsic information I1 that is then interleaved by the interleaver 17 to yield information I2 that can be used by the parity decoder 19, which calculates new extrinsic information I3. On the basis of this information I3 and the flexible data I4 corresponding to the redundant portion of the code, the internal decoder 21 calculates a message I5 that is then decoded by the parity decoder 19 to form a message I6 that is sent to the de-interleaver 17. De-interleaving of the message I6 by the de-interleaver 17 to produce a message I7 completes the iteration of the encoding process.

The major drawback of the encoder 10 (respectively decoder 20) is the latency introduced by its serial type architecture, the effect of which is to limit the encoding (respectively decoding) bit rate.

FIGS. 2A and 2B respectively show the scheduling of the various steps of the encoding process and the decoding process performed by the encoder 10 and the decoder 20, respectively.

With standard encoding using serially concatenated codes, each coder of the encoding device 10, i.e. the external coder 3, the parity coder 9 or the internal coder 11, is activated provided that the preceding coder has completed its task.

FIG. 2A represents very diagrammatically the scheduling in time (abscissa axis) of tasks (ordinate axis) constituting the encoding process executed by the encoder 10, these tasks being carried out successively by the external coder 3, the parity coder 9, and the internal coder 11 from FIG. 1A.

With such scheduling, a first coding step E10 is carried out by the external coder 3 for a time T10. When the step E10 has completely finished, the parity coder 9 executes a calculation step E30 for a time T30. When the step E30 has finished, it is followed by a coding step E50 carried out by the internal coder 11 for a time T50. The time needed to encode a sequence of bits at the input of the encoder 10 is therefore equal to the sum T10+T30+T50. This way of scheduling tasks therefore limits the encoding bit rate of the encoder 10.

FIG. 2B represents a distribution in time (abscissa axis) of decoding tasks (ordinate axis) performed by the decoder 20 from FIG. 1B during one iteration of the process.

According to FIG. 2B, the external decoder 15 executes a decoding step E70 for a time T70. When the step E70 has finished, the parity decoder 19 executes a calculation step E90 for a time T90. Once the step E70 has finished, the internal decoder 21 executes a step E110 for a time T110. The parity decoder 19 then executes a step E130 for a time T130. Thus the duration T of one iteration of the decoding process is equal to the sum of the durations of each of the above steps E70, E90, E110, E130, i.e. T=T70+T90+T110+T130.

The bit rates of the encoding and decoding processes described above are limited because of how the various tasks constituting the encoding and decoding processes are scheduled.

Moreover, the hardware resources of the encoder 10 and the decoder 20 are not used optimally, in the sense that each processing function is not used continuously in the coder 10 or the decoder 20.

OBJECT AND SUMMARY OF THE INVENTION

Thus a main object of the present invention is to eliminate the drawbacks referred to above by providing an encoding and decoding method having the property of encoding and decoding a data sequence very quickly and without significant loss of performance compared to prior art methods.

That object is achieved by a method of encoding an input bit sequence S0 to yield a coded bit sequence S, comprising the following steps:
- a first coding step applied to the bits of the input bit sequence S0 using a first code;
- an interleaving step in which interleaving means interleave the bits obtained using the first code; and
- a second coding step, referred to as a parity step, applied to the bits obtained from the interleaving means using a second code to generate the coded bit sequence S so that the parity, second coding step begins after a predetermined number $\Delta$ of bits. This predetermined number $\Delta$ of bits is between a first lower number $\Delta i$ of bits depending on one or more parameters of the interleaving step and a first higher number $\Delta s$ of bits corresponding to the total number of bits to be processed during the interleaving step.

In this kind of encoding method the parity, second coding step can be commenced without waiting for the end of the interleaving step, the second coding step being effected in parallel with the interleaving step and with a relative offset of $\Delta$ bits.

This method therefore parallelizes the parity coding and interleaving steps without having to duplicate all the functions and memories associated with the processing of tasks linked to those steps, in contrast to an architecture in which these tasks are scheduled sequentially.

This method therefore reduces the complexity of the encoding method, achieving performance exceeding or equal to that of prior art methods.

According to another feature of the invention, the parity, second coding step begins after a predetermined number $\Delta'$ of bits have been encoded by the first decoding step. This predetermined number $\Delta'$ of bits is between a second lower number $\Delta i'$ of bits depending on one or more parameters of the interleaving step and a second higher number $\Delta s'$ of bits corresponding to the total number of bits to be processed during the first coding step.

Thus in this encoding method the parity, second coding step can be commenced without waiting for the end of the interleaving step, the second coding step being effected in parallel with the first coding step and with an offset of $\Delta'$ bits.

The offset between the start of the first coding step and the start of the interleaving step can be adjusted and the minimum offset is an offset of 1 bit ($\Delta'-\Delta \leq 1$).

The interleaving step can advantageously be effected conjointly with the parity, second coding step.

According to another feature of the invention, the interleaving step includes a bit level first interleaving function $\pi$ associating with the $i^{th}$ bit obtained using the first code the $\pi(i)^{th}$ bit of an interleaved bit sequence, so that interleaving the first k bits supplies at least the first m bits of the interleaved bit sequence.

This feature therefore enables the parity, second coding step to be commenced without waiting for the end of the interleaving step.

According to another feature of the invention, the interleaving step and the parity, second coding step are effected by means of a quasi-cyclic parity check matrix V comprising a plurality of identity sub-matrices in the following form:

$$V = \begin{pmatrix} I[c(1,1)] & \cdots & & \cdots & I[c(1,m_2)] \\ \vdots & \ddots & & & \vdots \\ \vdots & & I[c(i,j)] & & \vdots \\ \vdots & & & \ddots & \vdots \\ I[c(m_1,1)] & \cdots & & \cdots & I[c(m_1,m_2)] \end{pmatrix}$$

such that for any i in the range 1 to $m_1$ and for any j in the range 1 to $m_2$, if the coefficient $c(i,j)$ is strictly negative then the sub-matrix $I[c(i,j)]$ is a null matrix, otherwise said sub-matrix $I[c(i,j)]$ is an identity matrix circularly permutated $c(i,j)$ positions.

The quasi-cyclic form of the parity check matrix V enables parallelization of the interleaving step and of the parity, second coding step, which are here effected conjointly.

According to another feature of the invention, the interleaving step includes a second interleaving function $\lambda$ for associating a first set of packets of $m_1$ bits obtained using the first code with a second set of packets of J bits of the interleaved bit sequence, so that bits belonging to the same packet of J bits of the interleaved bit sequence come from different packets of the first set of packets of $m_1$ bits.

This interleaving at the packet level prevents simultaneous access to the same memory space during the parity coding step. This type of interleaving therefore increases the encoding bit rate by minimizing the latency linked to memory access conflicts.

According to one feature of the invention, the positive coefficients $c(i,j)$ for the same row of the parity check matrix V are different.

To prevent memory access conflicts, it is necessary for bits involved in the same parity equation contained in the matrix V not to come from the same memory area. This condition is represented by the following mathematical relation applying to the positive coefficients of the matrix V for $j \neq k$:

$$\forall c(i,j) \leq 0 \text{ and } \forall c(i,k) \leq 0 : c(i,j) \neq c(i,k)$$

In other words, this condition guarantees that it is impossible to access the same memory simultaneously twice, thereby increasing the encoding bit rate by reducing the latency linked to memory access conflicts.

According to one feature of the invention, said parameter(s) determining the numbers of bits $\Delta$ and $\Delta'$ are a function of the positive coefficients $c(i,j)$ of said parity check matrix V.

According to another feature of the invention, the first code of the first coding step is made up of a first plurality of independent codes.

The first code can therefore be parallelized itself, further increasing the encoding bit rate in the first encoding step.

According to another feature of the invention, the encoding method includes a third coding step using a third code applied to bits obtained from the parity, second coding step so that the third coding step begins by coding one or more bits obtained from the parity, second decoding step.

The third code of the third coding step can therefore be chosen so that it has additional properties compared to the first code of the first coding step, for example, to increase the correction capability of the code formed by concatenating the first, second, and third codes.

The third code of the third coding step advantageously consists of a second plurality of independent codes.

The third code can therefore be parallelized itself, further increasing the encoding bit rate in the third coding step.

The invention is also directed to a method of decoding a receive digitized signal comprising a data sequence formed of a first part corresponding to information to be transmitted and a second part including redundant data, comprising:
  a first decoding step applied to data of said first part;
  an interleaving step in which interleaving means interleave data obtained from the first decoding step; and
  a second decoding step, referred to as a parity step, applied to data obtained from the interleaving means.

The parity, second decoding step advantageously begins after a predetermined number $\Delta$ of data items have been interleaved. This predetermined number $\Delta$ of data items is between a first lower number $\Delta i$ of data items depending on one or more parameters of the interleaving step and a first higher number $\Delta s$ of data items corresponding to the total number of data items to be processed during the interleaving step.

This method therefore parallelizes the parity coding and interleaving steps without having to duplicate all the functions and memories associated with processing tasks linked to those steps.

According to another feature of the invention, the parity, second decoding step begins after a predetermined number $\Delta'$ of data items have been decoded in the first decoding step. This predetermined number $\Delta'$ of data items being is a second lower number $\Delta i'$ of data items depending on one or more parameters of the interleaving step and a second higher number $\Delta s'$ of data items corresponding to the total number of data items to be processed during the first decoding step.

According to another feature of the invention, the decoding method includes a third decoding step of decoding data obtained from the parity, second decoding step, the third decoding step starting by decoding one or more data items obtained from the parity, second decoding step.

According to another feature of the invention, the interleaving step is effected conjointly with the parity, second decoding step.

According to another feature of the invention, the interleaving step and the second decoding step are effected by means of a quasi-cyclic parity check matrix V comprising a plurality of identity sub-matrices in the following form:

$$V = \begin{pmatrix} I[c(1,1)] & \cdots & \cdots & \cdots & I[c(1,m_2)] \\ \vdots & \ddots & & & \vdots \\ \vdots & & I[c(i,j)] & & \vdots \\ \vdots & & & \ddots & \vdots \\ I[c(m_1,1)] & \cdots & \cdots & \cdots & I[c(m_1,m_2)] \end{pmatrix}$$

such that for any i in the range 1 to $m_1$ and for any j in the range 1 to $m_2$, if the coefficient $c(i, j)$ is strictly negative then the sub-matrix $I[c(i,j)]$ is a null matrix, otherwise said sub-matrix $I[c(i, j)]$ is an identity matrix circularly permutated $c(i, j)$ positions.

According to another feature of the invention, the positive coefficients $c(i, j)$ for the same column of the parity check matrix V are different.

To prevent memory access conflict that would generate latency and would be reflected in a reduction of the decoding bit rate, it is necessary for a variable not to be involved more than once in a group of $m_2$ parity equations contained in the matrix V, which is reflected in the positive coefficients of the matrix V by the following mathematical relation:

$$\forall c(i,j) \leqq 0 \text{ and } \forall c(i,j+1) : c(i,j) \neq c(i+1,j) \forall i, \forall j$$

According to another feature of the invention, the parameter(s) determining the numbers $\Delta$ and $\Delta'$ of data items are a function of the positive coefficients $c(i, j)$ of the parity check matrix V.

Another aspect of the invention is directed to a device for encoding an input bit sequence S0 to yield a coded bit sequence S, comprising:
  first coding means for coding the bits of the input bit sequence S0 using a first code;
  interleaving means for interleaving bits obtained from the first coding means; and
  second coding means, referred to as parity means, for coding bits obtained from the interleaving means using a second code to generate the coded bit sequence S.

The interleaving means are advantageously such that the parity, second coding means begin the coded bit sequence S after a predetermined number $\Delta$ of bits have been interleaved. This predetermined number $\Delta$ of bits is between a first lower number $\Delta i$ of bits depending on one or more parameters of the interleaving means and a first higher number $\Delta s$ corresponding to the total number of bits to be processed by the interleaving means.

The encoding device can in particular be adapted to implement the above encoding method.

Another aspect of the invention is directed to a device for decoding a receive digitized signal comprising a data sequence formed of a first part corresponding to information to be transmitted and a second part including redundant data. This device comprises:
  first decoding means for decoding data items of the first part;
  interleaving means for interleaving bits obtained from the first coding means; and
  second decoding means, referred to as parity means, for decoding bits obtained from the interleaving means.

The interleaving means are such that the parity, second decoding means begin parity decoding after a predetermined number $\Delta$ of data items have been interleaved. This predetermined number $\Delta$ of data items is between a first lower number $\Delta i$ of data items depending on one or more parameters of the interleaving step and a first higher number $\Delta s$ of data items corresponding to the total number of data items to be processed by the interleaving means.

The decoding device can in particular be adapted to execute the above decoding method.

Another aspect of the invention is directed to a computer program product adapted to be downloaded from a communications network and/or stored on a computer-readable medium and/or executed by a microprocessor, comprising program code instructions for executing steps of the encoding method described above when it is executed on a computer.

Another aspect of the invention is directed to a computer program product adapted to be downloaded from a communications network and/or stored on a computer-readable medium and/or executed by a microprocessor, comprising program code instructions for executing steps of the decoding method described above when it is executed on a computer.

BRIEF DESCRIPTION OF THE DRAWINGS

Other features and advantages of the present invention emerge from the following description with reference to the appended drawings, which show one non-limiting embodiment of the present invention. In the figures.

DETAILED DESCRIPTION OF EMBODIMENTS OF THE INVENTION

Figure 1A:
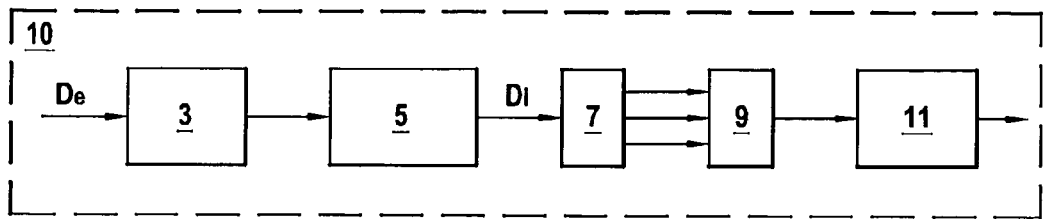
FIGS. 1A and 1B, already described above, respectively represent a prior art encoder and a prior art decoder.
Figure 1B:
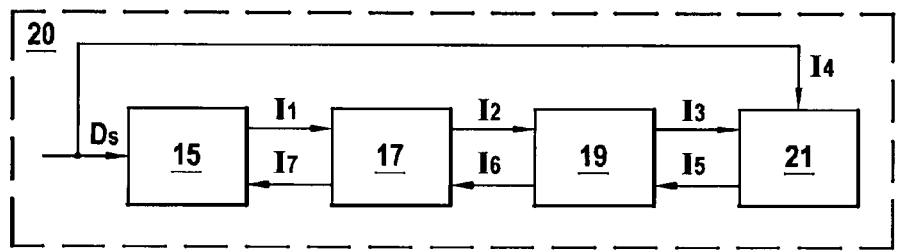
Figure 2A:
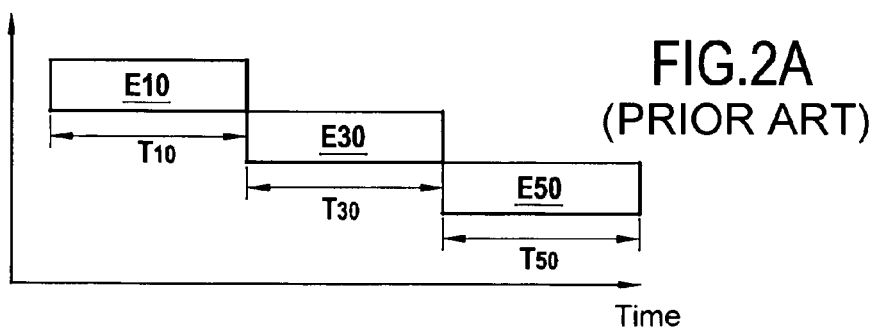
FIGS. 2A and 2B, already described above, respectively represent the scheduling of the prior art encoding and decoding steps.
Figure 2B:
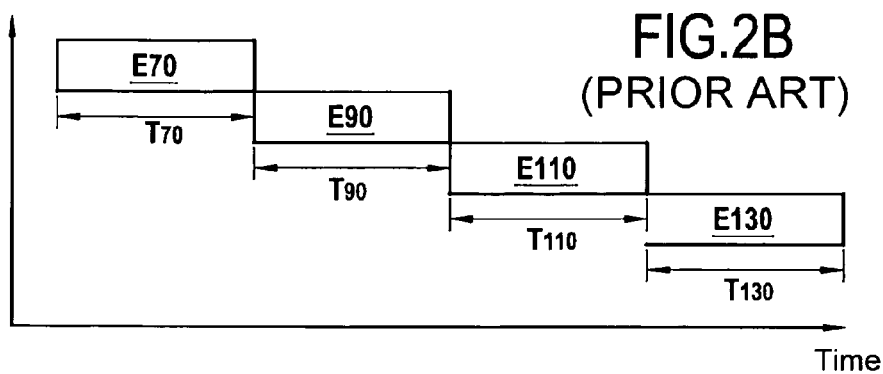
Figure 3:
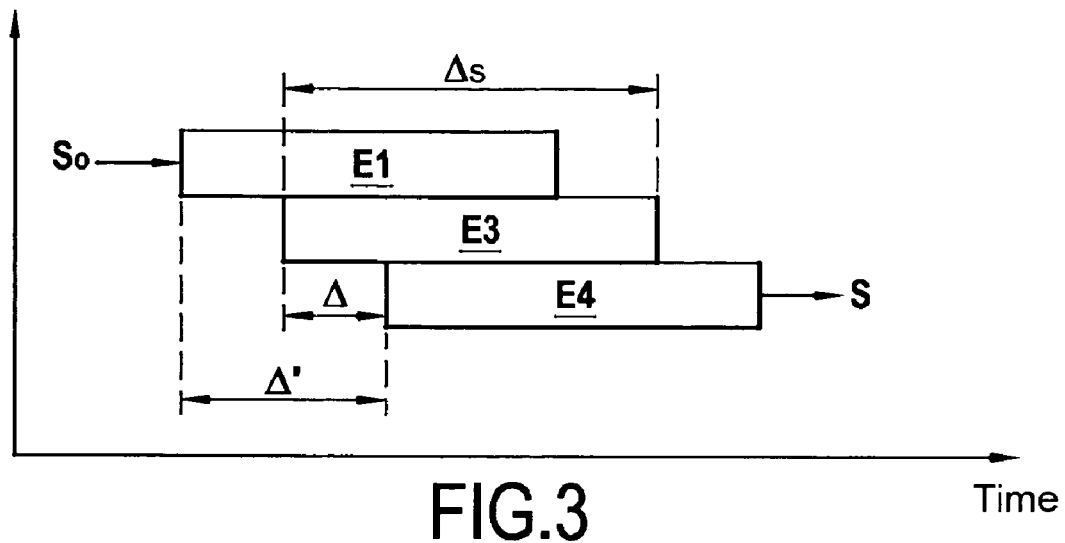
FIG. 3 represents the scheduling of the encoding steps of the invention.

FIG. 3 shows the scheduling in time (abscissa axis) of the steps (ordinate axis) of an encoding method of the invention for encoding an input bit sequence S0 to yield a coded bit sequence S.

This method includes a first coding step E1 applied to the bits of the input bit sequence S0, using a first code. The bits produced by this first coding step are interleaved by interleaving means 33 (see FIG. 6) during an interleaving step E3.

The bits coming from the interleaving means 33 are encoded in a second coding step E4 referred to as a parity step using a second code to generate the coded bit sequence S.

The parity, second coding step E4 advantageously begins after interleaving a predetermined number $\Delta$ of bits. This predetermined number $\Delta$ of bits is between a first lower number $\Delta i$ of bits depending on one or more parameters of the interleaving step E3 and a first higher number $\Delta s$ of bits corresponding to the total number of bits to be processed during the interleaving step E3.

Figure 4:
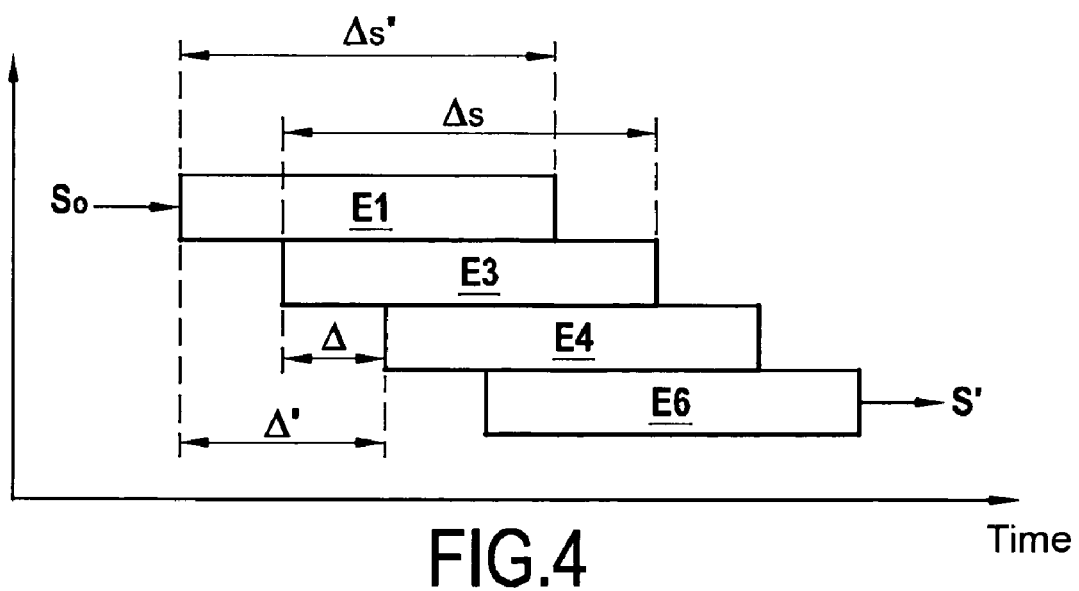
FIGS. 4 and 7 respectively represent the scheduling of the encoding and decoding steps of one embodiment of the present invention.

FIG. 4 shows by way of example the interleaving in time (abscissa axis) of the various steps (ordinate axis) constituting one embodiment of an encoding method of the invention.

This encoding method comprises the following steps to encode an input bit sequence S0 to yield a coded bit sequence S'.

A first coding step E1 (external coding) is applied to the bits of the input bit sequence S0 by first coding means 30 (external coder 30), using a first code (external code) defined by an external code parity check matrix G1.

In an interleaving step E3 interleaving means 33 ("interleaver" 33) interleave bits from the external code at the bit and packet levels.

The bits coming from the interleaver 33 are coded by parity, second coding means 32 (parity coder 32) during a parity, second coding step E4, using a parity code defined in the parity code parity check matrix V.

A second (internal) coding step E6 is applied to bits coming from the parity coder 32 to form the coded bit sequence S' using the code defined by an internal code parity check matrix G2.

The parity coding step E4 advantageously begins after a time proportional to a predetermined number $\Delta$ of bits, i.e. after interleaving the first $\Delta$ bits. This predetermined number $\Delta$ is between a first lower number $\Delta i$ of bits and a first higher number $\Delta s$ of bits corresponding to the total number of bits to be processed during the interleaving step E3. The parity coding step E4 is therefore effected in parallel with the interleaving step E3 and with an offset of $\Delta$ bits.

The interleaving step E3 begins and is effected in parallel with the external coding step E1 with an offset of at least one bit ($\Delta'$-$\Delta \leqq 1$). In the same way, the internal coding step E6 begins and is effected in parallel with the parity coding step E4 with an offset of at least one bit.

Figure 6:
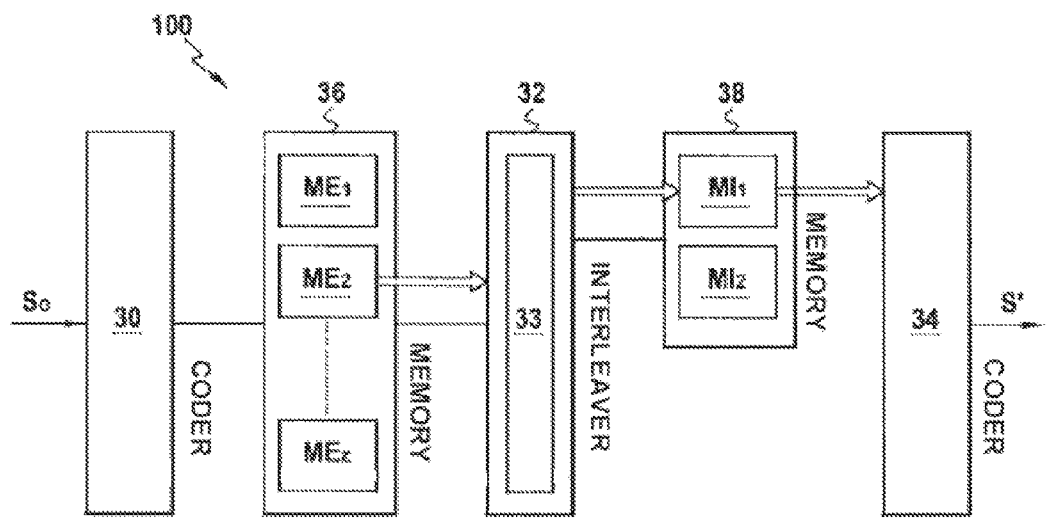
FIGS. 6 and 8 are diagrams respectively representing an encoding device of the invention and a decoding device of the invention.

In a preferred embodiment, the code in question is an LDPC (low density parity check) code constructed from a parity check matrix H of the following form:

$$H = \begin{bmatrix} G1 & I & 0 \\ 0 & V & G2 \end{bmatrix} \quad (2)$$

in which:

G1 is an external code parity check matrix associated with the external coder 30 (see FIG. 6);

V is a parity check matrix of a code comprising the parity code and the interleaving function; and G2 is the internal code parity check matrix associated with the internal coder 34 (see FIG. 6).

The external code is defined on the basis of the matrix G1, which is a K×K square matrix of the following form:

$$G1 = \begin{bmatrix} I & & & Ip \\ I & I & & \\ & \ddots & \ddots & \\ & & I & I \end{bmatrix} \quad (3)$$

in which I is a z×z identity matrix and p is a z×z identity matrix circularly permutated p positions to the right or to the left.

It is optionally possible to parallelize the external coding/decoding step by setting the value of the number "p" so that the external code is made up of a plurality of independent codes, thus increasing the encoding/decoding speed (at the external coding/decoding level).

In this example, if p=0, the external code is made up of "z" independent codes. Otherwise (i.e. if p≠0), the external code is made up of "z/b" independent codes, where b is the lowest positive non-zero integer such that:

$$(b.p) \bmod z = 0 \quad (4)$$

For example, the external code can be made up of a plurality of independent circular convolutional codes that function in parallel, thus increasing the encoding bit rate.

The internal code is defined on the basis of the matrix G2, which is an M×M square matrix of the following form:

$$G2 = \begin{bmatrix} I & & & Ie \\ I & I & & \\ & \ddots & \ddots & \\ & & I & I \end{bmatrix} \quad (5)$$

in which I is a z×z identity matrix and Ie is a z×z identity matrix permutated non-circularly "e" positions to the right or to the left.

As with external coding, it is optionally possible to parallelize the internal coding step by setting the value of the number "e" so that the internal code is made up of a plurality of independent codes, thus increasing the encoding speed at the internal coding level.

In this example, if e=0, the internal code is made up of "z" independent codes. Otherwise (i.e. if e≠0), the external code is made up of a number of independent codes equal to the number "e".

For example, the internal code can be made up of a plurality of independent recursive circular convolutional codes functioning in parallel, thus increasing the encoding bit rate.

The matrix V is a quasi-cyclic M×K matrix comprising a plurality of null matrices and/or circularly permutated identity matrices, the matrix V being defined by the following relation:

$$V = \begin{pmatrix} I[c(1,1)] & \cdots & & \cdots & I[c(1, m_2)] \\ \vdots & \ddots & & & \vdots \\ \vdots & & I[c(i,j)] & & \vdots \\ \vdots & & & \ddots & \vdots \\ I[c(m_1,1)] & \cdots & & \cdots & I[c(m_1, m_2)] \end{pmatrix} \quad (6)$$

in which:

$m_1$ is a strictly positive integer such that:

$$K = m_1 \times z \quad (7)$$

$m_2$ is a strictly positive integer such that:

$$M = m_2 \times z \quad (8)$$

I[c(i, j)] is either a z×z null matrix or a z×z circularly permutated identity matrix; if c(i, j)<0, then I[c(i, j)] is a null matrix; otherwise, I[c(i, j)] is an identity matrix circularly permutated c(i, j) positions to the right or to the left.

The form of the matrix V as described above comprises a parity code and interleaving at bit level and at packet level in accordance with the invention.

Figure 5A:
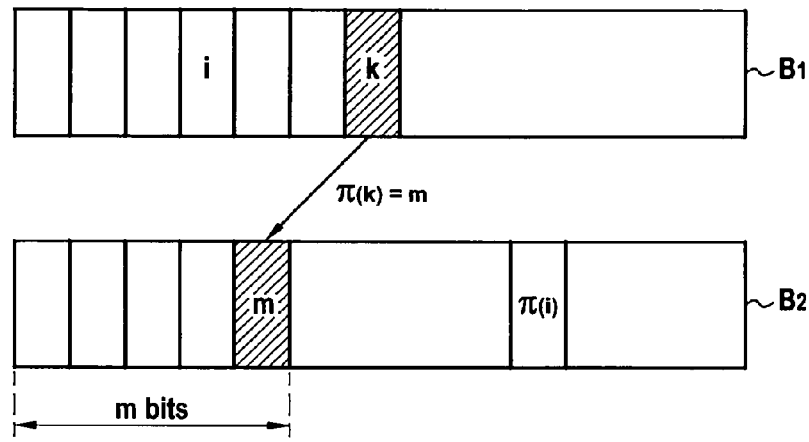
FIGS. 5A and 5B respectively represent interleaving in accordance with the present invention at bit level and at packet level.
Figure 5B:
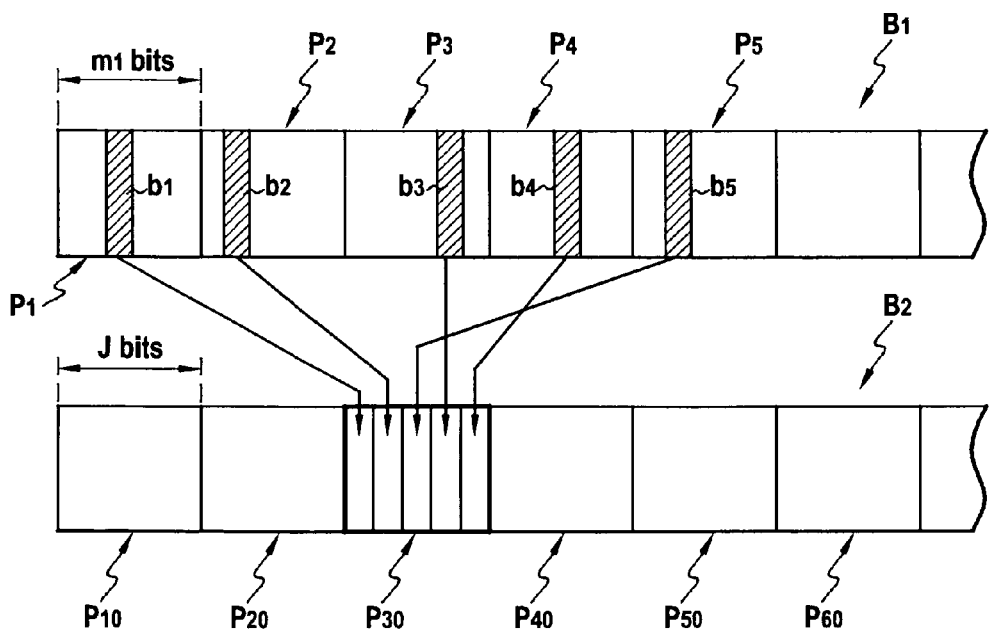

FIGS. 5A and 5B respectively represent interleaving at the bit level by a first function π and interleaving at the packet level by a second function λ.

In FIG. 5A, the bits at the output of the external coder belonging to a first block $B_1$ of bits are interleaved using the first interleaving function π to form a second block $B_2$ of interleaved bits.

This first interleaving function π associates with any bit of index "i" belonging to the first block $B_1$ of bits the bit of index π(i) of the block $B_2$ of interleaved bits, so that the interleaving of the first k bits of the first block $B_1$ of bits provides at least the first m bits of the second block $B_2$ of interleaved bits. Accordingly, in this example, the next bit of index k+1 of the first block $B_1$ of bits to be processed is at the position with index π(k+1) in the second block $B_2$ of interleaved bits, so that π(k+1)>m.

Accordingly, if the parity coding is effected by blocks of J=m bits, this interleaving function means that the coding of the first J bits coming from the interleaving means 33 can be commenced without having to wait for the end of the interleaving step E3. In contrast to the above-mentioned prior art, it is not necessary to wait for all the bits at the output of the external coder to be interleaved by the interleaving means 33 to be able to commence the parity coding step E4.

In FIG. 5B, the bits belonging to the first block $B_1$ of bits at the output of the external coder 30 are interleaved using a second interleaving function λ, that associates a first set of packets ($P_1$, $P_2$, $P_3$, $P_4$, $P_5$) of $m_1$ bits belonging to the first block $B_1$ of bits with a second set of packets ($P_{10}$, $P_{20}$, $P_{30}$, $P_{40}$, $P_{50}$, $P_{60}$) of J interleaved bits so that the bits belonging to the same packet $P_{30}$ of J interleaved bits all come from separate packets belonging to the first set of packets ($P_1$, $P_2$, $P_3$/$P_4$, $P_5$) of $m_1$ bits. In the FIG. 5B example, the packet $P_{30}$ is made up of five bits ($b_1$, $b_2$, $b_3$, $b_4$, $b_5$) coming from five respective packets ($P_1$, $P_2$, $P_3$, $P_4$, $P_5$).

In the preferred embodiment, the form of the matrix V as described above enables interleaving at bit level and at packet level in accordance with the first function π and the second function λ, respectively. Thus each bit of index "π(i)" belonging to the $i^{th}$ packet of J interleaved bits is associated with the $(i)^{th}$ bit belonging to the $\lambda^{-1}(i,l)^{th}$ packet of $m_1$ bits.

In the encoding (respectively decoding) method of the invention, the parameters of the parallelization of the parity coding (respectively decoding) step and the external coding (respectively decoding) step are determined by a predetermined metric Δ corresponding to a predetermined number of bits.

The value of this number Δ is calculated from the strictly positive coefficients c(i, j) of the matrix V, in the following manner:

Let $\Phi \equiv \{c_i\}$ be the set of positive and non-zero coefficients c(i, j) of the matrix V, in increasing order. Let "d" be a function for calculating the distance between two points x and y where x≦y, defined by d(x, y)=(x−y). The value of this number Δ is then calculated using the following relation:

$$\Delta = \text{Max}(\Delta_1, c_0 + z - c_{card(\Phi)-1}) \quad (9)$$

in which:

card(Φ) represents the number of elements of the set Φ;

$c_0$ is the lowest positive non-zero coefficient c(i, j) of the parity check matrix V;

z is the dimension of the identity sub-matrices contained in the parity check matrix V; and $\Delta_1$ is the greatest distance between any two adjacent elements ($c_i$ and $c_{i+1}$) belonging to the set Φ, that distance being defined by the following relation:

$$\Delta_1 = \text{Max}(\{d(c_{i+1}, c_i)\}_{i \in [0, card(\Phi)-1]}) \quad (10)$$

FIG. 6 shows one embodiment of an encoding device 100 of the invention, comprising a first (external) coder 30 (first coding means), a parity coder 32 (second coding means) comprising an interleaver 33 (interleaving means), an internal coder 34 (third coding means), first memory means 36 between the external coder 30 and the parity coder 32, and second memory means 38 between the parity coder 32 and the internal coder 34.

Note that in a different embodiment the interleaver 33 and the parity coder 32 can be separate.

The first memory 36 includes a first set of "z" first memory banks ($ME_1$ to $ME_z$) each having a storage capacity of $m_1$ bits.

The second memory 38 includes at least two second memory banks ($MI_1$ and $MI_2$) each having a storage capacity of $m_2$ bits.

An input block of bits B0 is encoded by the encoding device 100 of the invention to yield a coded bit sequence S.

The external coder 30 begins to code the input block of bits B0 to generate first bits at the output of the external coder 30 that are stored directly in the first memory bank ($ME_1$ to $ME_z$) of the memory 36, in the natural order and in packets of $m_1$ bits.

After a time proportional to the predetermined number Δ, the parity coder 32 reads a bit in each memory bank of a subset of the first set of memory banks ($ME_1$ to $ME_z$) and adds these bits by a modulo-2 addition operation in accordance with parity laws defined in the matrix V (each row of the matrix V defining a parity equation).

For example, the parity coder 32 can process $m_2$ parity equations contained in $m_2$ rows of the matrix V to generate $m_2$ bits at the output of the parity coder 32. Those $m_2$ bits are stored directly in a memory bank $MI_1$ of the second set of memory banks ($MI_1$ and $MI_2$) of the memory 38.

As soon as the $m_2$ bits have been written into a memory bank ($MI_1$, $MI_2$) at the output of the parity coder 32, the internal coder 34 reads those $m_2$ bits, which it can begin to code virtually instantaneously using the internal code contained in the internal code parity check matrix G2.

Given that the internal coding operation is effected on $m_2$ bits and just after writing $m_2$ bits into a second memory bank ($MI_1$ in this example), it suffices for the second memory 38 to contain only two memory blocks ($MI_1$, $MI_2$) to enable optimum use of hardware resources, each of these two memory banks functioning alternately in write mode or read mode.

In practice, it is sufficient for the parity code to have processed one bit for the internal coder to be able to commence its task in parallel with the parity coder.

Figure 7:
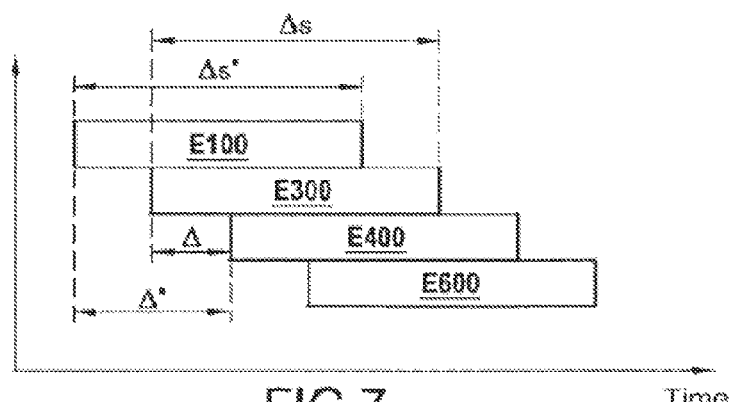

FIG. 7 is a very diagrammatic illustration of the scheduling in time (abscissa axis) of the various steps (ordinate axis) constituting one particular embodiment of a decoding method.

This decoding method decodes a receive digitized signal comprising a data sequence formed of a first part D corresponding to information to be transmitted and a second part C containing redundant data.

In this method, a first (external) decoding step E100 is applied to data from the first part D. An interleaving step E300 effected by interleaving means 43 (interleaver 43) interleaves data coming from the first (external) decoding step E100. A parity, second decoding step E400 is applied to data coming from the interleaver 43. A third (internal) decoding step E600 is applied to data coming from the parity decoding step E400.

The parity decoding step E400 advantageously begins after interleaving a predetermined number Δ of data bits. This predetermined number Δ of data bits is between a first lower number Δi of data bits depending on one or more parameters of the interleaving step E300 and a first higher number Δs of data bits corresponding to the total number of data bits to be processed during the interleaving step E300.

Figure 8:
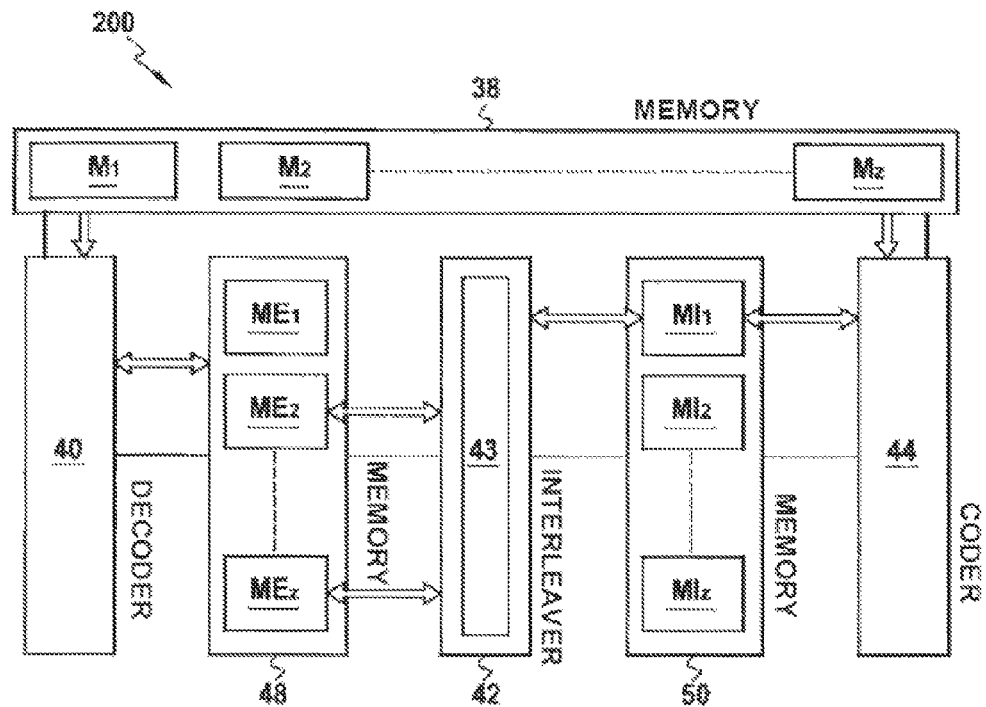

FIG. 8 shows an embodiment of a decoding device 200 of the invention for decoding a receive digitized signal containing a data sequence formed of a first part D corresponding to information to be transmitted and a second part C containing redundant data.

The decoding device 200 of the invention comprises an external decoder 40 (first decoding means 40), a parity decoder 42 (parity, second decoding means 42) comprising an interleaver 43 (interleaving means 43), an internal decoder 44 (second decoding means 44), a first memory module 46 at the input of the external decoder 40 and the internal decoder 44, a second memory module 48 between the external decoder 40 and the parity decoder 42, and a third memory module 50 between the parity coder 42 and the internal coder 44.

Note that in a different embodiment the interleaver 43 and the parity decoder 42 can be separate.

The interleaver 43 is such that the parity decoder 42 begins the parity decoding step E400 after a predetermined number Δ of data bits have been interleaved. This predetermined number Δ of data bits is between a first lower number Δi of data bits depending on one or more parameters of the interleaver 43 and a first higher number Δs of data bits corresponding to the total number of data bits to be processed by the interleaver 43.

The first memory module 46 for storing a receive digitized signal including "$m_1 \times z$" flexible values comprises "z" first memory banks ($M_1$ to $M_z$) each having a storage capacity of $m_1$ bits.

The second memory module 48 for storing data in transit between the external decoder 40 and the parity decoder 42 comprises "z" second memory banks ($MI_1$ to $MI_z$) each having a storage capacity of $m_1$ bits.

The third memory module 50 for storing data in transit between the parity decoder 42 and the internal decoder 44 comprises "z" second memory banks ($MI_1$ to $MI_z$) each having a storage capacity of $m_2$ bits.

Dividing the memories 46, 48, 50 into a respective plurality of memory banks ($M_1$ to $M_z$), ($ME_1$ to $ME_z$), ($MI_1$ to $MI_z$) minimizes or even eliminates simultaneous access to the same memory.

A frame of N flexible values is decoded iteratively. Note that flexible decoding of the internal code and the external code can be effected using standard techniques for decoding flexible output convolutional codes, such as the Bahl-Cocke-Jelinek-Raviv algorithm, the forward backward algorithm, or the soft output Viterbi algorithm, as described by L. R. Bahl et al. in the document entitled "Optimal Decoding of Linear Codes for Minimizing Symbol Error Rate" (IEEE Transactions on Information Theory, Volume IT-20, March 1974, pp. 248-287).

The initialization step of this method consists in storing in the first "z" memory banks ($M_1$ to $M_z$) of the first memory module 46, in natural order and in packets of $m_1$ flexible values, $N=m_1 \times z$ data items contained in a receive signal.

In other words, the first $m_1$ flexible values of the received signal are stored in the first memory bank $M_1$, the next $m_1$ flexible values are stored in the next memory bank $M_2$, and so on.

The method includes the following steps on each iteration.

The external decoder 40 effects decoding over a window of index j comprising $m_1$ data bits (or $m_1$ flexible values) contained in the memory bank $M_j$ belonging to the first memory module 46 to generate first extrinsic data that is stored in the memory bank $ME_j$ belonging to the second memory module 48.

After decoding a number Δ of windows, the parity decoder 42 can function in parallel with and without conflict with the external decoder 40.

The parity equations defined in the matrix V are solved in series and in groups of $m_2$ equations using variables or data supplied at the output of the external coder. The values of each of these variables used in the $m_2$ parity equations of the matrix V during the decoding of a window are read in different memory banks ($ME_1$ to $ME_z$). For each window of index i, the $m_2$ equations of the $i^{th}$ group of $m_2$ equations are solved in the following order: i, i+z, i+2×z, ..., i+$m_2$×z, (with i in the range 1 to z).

The result of decoding the $i^{th}$ group of $m_2$ equations is stored in the $i^{th}$ memory bank $MI_i$ belonging to the third memory module 50. For example, the $m_2$ data bits resulting from solving the $2^{nd}$ group of $m_2$ parity equations are stored in the $2^{nd}$ memory bank $MI_2$.

Directly after the parity coder has solved the first group of $m_2$ equations over a window of index i, the internal decoder can commence its task of decoding over this window. The extrinsic information resulting from decoding the window of index i is stored in the memory bank $MI_i$ belonging to the third memory module 50.

Following decoding of Δ windows by the internal decoder, the variables involved in the parity equations defined in the matrix V are updated.

To prevent any conflict of access to the same memory bank during the parity decoding step, a variable must not be involved more than once in a group of $m_2$ parity equations. This rule is reflected in the condition that all positive coefficients c(i, j) for the same column of the matrix V are different.

The invention is also directed to a computer program downloadable from a communications network comprising program code instructions for executing steps of the encoding method and/or the decoding method of the invention when it is executed in a computer. This computer program can be stored on a computer-readable medium.

This program can use any programming language and take the form of source code, object code or an intermediate code between source code and object code, such as a partially compiled form, or any other desirable form.

The invention is also directed to a computer-readable information medium containing instructions of the above computer program.

The information medium can be any entity or device capable of storing the program. For example, the medium can include storage means, such as a ROM, for example a CD ROM or a microelectronic circuit ROM, or magnetic storage means, for example a diskette (floppy disk) or a hard disk.

Moreover, the information medium can be a transmissible medium such as an electrical or optical signal, which can be routed via an electrical or optical cable, by radio or by other means. The program of the invention can in particular be downloaded over an Internet-type network.

Alternatively, the information medium can be an integrated circuit into which the program is incorporated, the circuit being adapted to execute the method in question or to be used in its execution.

Figure 9:
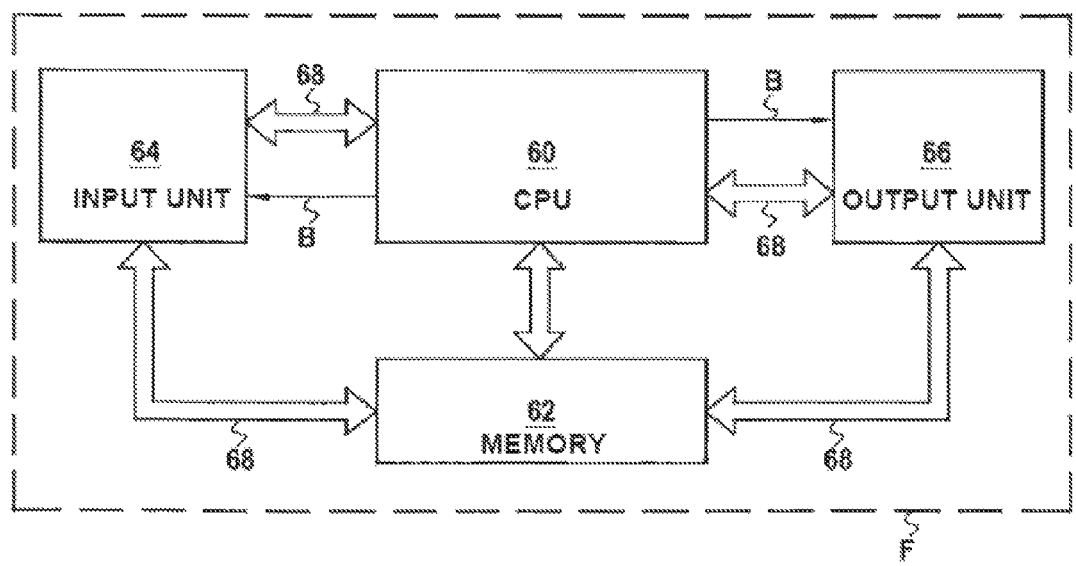
FIG. 9 is a diagram showing a data processing system using the encoding and/or decoding device of the invention.

Note that the encoding device can be implemented by a data processing system F, as shown in FIG. 9, conventionally including a central processor unit 60 controlling by signals B a memory 62, an input unit 64, and an output unit 66. All these elements are interconnected by data busses 68.

Moreover, this data processing system can be used to execute a computer program including instructions for executing the encoding method of the invention.

Note that the decoding device can also be implemented by a data processing system like that from FIG. 9.

Moreover, that data processing system can be used to execute a computer program including instructions for executing the decoding method of the invention.

The invention claimed is:

1. A method of encoding an input bit sequence (S0) to yield a coded bit sequence (S), said method comprising:
   a first coding step (E1) applied to the bits of the input bit sequence (S0) using a first code to generate an output bit sequence;
   an interleaving step (E3) in which interleaving means (33) interleave the bits of the output bit sequence obtained using said first code; and
   a second coding step (E4), referred to as a parity step, applied to the bits obtained from said interleaving means (33) using a second code to generate said coded bit sequence (S);
   wherein said parity, second coding step (E4) begins after a predetermined number Δ of bits have been interleaved without waiting for the end of the interleaving step (E3), said predetermined number Δ of bits being less than a first higher number Δs of bits corresponding to the total number of bits to be processed during said interleaving step (E3), such that the first higher number Δs of bits is less than or equal to a length of the output bit sequence generated by the first coding step.

2. The encoding method according to claim 1, wherein said parity, second coding step (E4) begins after a predetermined number Δ' of bits have been encoded by the first decoding step (E1), said predetermined number Δ' of bits being between a second lower number Δi' of bits depending on one or more parameters of said interleaving step (E3) and a second higher number Δs' of bits corresponding to the total number of bits to be processed during said first coding step (E1).

3. The encoding method according to claim 1, wherein said interleaving step (E3) is effected conjointly with said parity, second coding step (E4).

4. The encoding method according to claim 3, wherein said interleaving step (E3) and said parity, second coding step (E4) are effected by means of a quasi-cyclic parity check matrix V comprising a plurality of identity sub-matrices in the following form:

$$V = \begin{pmatrix} I[c(1,1)] & \cdots & \cdots & \cdots & I[c(1,m_2)] \\ \vdots & \ddots & & & \vdots \\ \vdots & & I[c(i,j)] & & \vdots \\ \vdots & & & \ddots & \vdots \\ I[c(m_1,1)] & \cdots & \cdots & \cdots & I[c(m_1,m_2)] \end{pmatrix}$$

such that for any i in the range 1 to $m_1$ and for any j in the range 1 to $m_2$, if the coefficient c(i, j) is strictly negative then the sub-matrix I[c(i, j)] is a null matrix, otherwise said sub-matrix I[c(i, j)] is an identity matrix circularly permutated c(i, j) positions.

5. The encoding method according to claim 4, wherein the positive coefficients c(i, j) for the same row of said parity check matrix V are different.

6. The encoding method according to claim 1, wherein said interleaving step (E3) includes a bit level first interleaving function π associating with the $i^{th}$ bit obtained using said first code the $π(i)^{th}$ bit of an interleaved bit sequence (B2), so that interleaving the first k bits supplies at least the first m bits of said interleaved bit sequence (B2).

7. The encoding method according to claim 1, wherein said interleaving step (E3) includes a second interleaving function λ for associating a first set of packets ($P_1, P_2, P_3, P_4, P_5$) of $m_1$ bits obtained using the first code with a second set of packets ($P_{10}, P_{20}, P_{30}, P_{40}, P_{50}, P_{60}$) of J bits of said interleaved bit sequence (B2), so that bits belonging to the same packet (P30) of J bits of said interleaved bit sequence (B2) come from different packets of said first set of packets ($P_1, P_2, P_3, P_4, P_s$) of $m_1$ bits.

8. The encoding method according to claim 1, wherein said parameter(s) determining the numbers $\Delta$ and $\Delta'$ of bits are a function of the positive coefficients $c(i, j)$ of said parity check matrix V.

9. The encoding method according to claim 1, wherein said first code of said first coding step (E1) is composed of a first plurality of independent codes.

10. The encoding method according to claim 1, further comprising a third coding step (E6) using a third code applied to bits obtained from said parity, second coding step (E4) so that said third coding step (E6) begins by coding one or more bits obtained from said parity, second decoding step (E4).

11. The encoding method according to claim 10, wherein said third code of said third coding step (E6) is composed of a second plurality of independent codes.

12. A computer program stored on a computer memory and executing on a microprocessor, comprising program code instructions for executing steps of the encoding method according to claim 1 when it is executed on a computer.

13. The encoding method according to claim 1, wherein said predetermined number $\Delta$ of bits is greater than a first lower number $\Delta i$ of bits which depends on one or more parameters of said interleaving step (E3).

14. A process in which a computer executes instructions set forth in a computer program, the computer program including instructions for executing steps of the encoding method according to claim 1.

15. A computer program stored on a non-transitory computer-readable medium, comprising program code instructions for executing steps of the encoding method according to claim 1 when it is executed on a computer.

16. A method of decoding a receive digitized signal comprising a data sequence formed of a first part D corresponding to information to be transmitted and a second part C including redundant data, wherein said method comprises:
    a first decoding step (E100) applied to data of said first part D to generate an output data sequence;
    an interleaving step (E300) in which interleaving means (43) interleave data of the output data sequence obtained from said first decoding step (E100); and
    a second decoding step (E400), referred to as a parity step, applied to data obtained from said interleaving means (43);
    wherein said parity, second decoding step (E400) begins after a predetermined number $\Delta$ of data items have been interleaved without waiting for the end of the interleaving step (E300), said predetermined number $\Delta$ of data items being less than a first higher number $\Delta s$ of data items corresponding to the total number of data items to be processed during said interleaving step (E300), such that the first higher number $\Delta s$ of data items is less than or equal to a length of the output data sequence generated by the first decoding step.

17. The decoding method according to claim 16, wherein said parity, second decoding step (E400) begins after a predetermined number $\Delta'$ of data items have been decoded in said first decoding step (E100), said predetermined number $\Delta'$ of data items being between a second lower number $\Delta i'$ of data items depending on one or more parameters of said interleaving step (E300) and a second higher number $\Delta s'$ of data items corresponding to the total number of data items to be processed during said first decoding step (E100).

18. The decoding method according to claim 16, further comprising a third decoding step (E600) for decoding data obtained from said parity, second decoding step (E400), said third decoding step (E600) starting by decoding one or more data items obtained from said parity, second decoding step (E400).

19. The decoding method according to claim 16, wherein said interleaving step (E300) is effected conjointly with said parity, second decoding step (E400).

20. The decoding method according to claim 19, wherein said interleaving step (E300) and said second decoding step (E400) are effected by means of a quasi-cyclic parity check matrix V comprising a plurality of identity sub-matrices in the following form:

$$V = \begin{pmatrix} I[c(1,1)] & \cdots & & \cdots & I[c(1,m_2)] \\ \vdots & \ddots & & & \vdots \\ \vdots & & I[c(i,j)] & & \vdots \\ \vdots & & & \ddots & \vdots \\ I[c(m_1,1)] & \cdots & & \cdots & I[c(m_1,m_2)] \end{pmatrix}$$

such that for any i in the range 1 to $m_1$ and for any j in the range 1 to $m_2$, if the coefficient $c(i, j)$ is strictly negative then the sub-matrix $I[c(i, j)]$ is a null matrix, otherwise said sub-matrix $I[c(i, j)]$ is an identity matrix circularly permutated $c(i, j)$ positions.

21. The decoding method according to claim 20, wherein the positive coefficients $c(i, j)$ for the same column of said parity check matrix V are different.

22. The decoding method according to claim 20, wherein said parameter(s) determining the numbers $\Delta$ and $\Delta'$ of data items are a function of the positive coefficients $c(i, j)$ of said parity check matrix V.

23. A computer program stored on a computer memory and executing on a microprocessor, comprising program code instructions for executing steps of the decoding method according to claim 16 when it is executed on a computer.

24. The decoding method according to claim 16, wherein said predetermined number $\Delta$ of data items is greater than a first lower number $\Delta i$ of bits which depends on one or more parameters of said interleaving step (E300).

25. A process in which a computer executes instructions set forth in a computer program, the computer program including instructions for executing steps of the decoding method according to claim 16.

26. A computer program stored on a non-transitory computer-readable medium, comprising program code instructions for executing steps of the decoding method according to claim 16 when it is executed on a computer.

27. A device for encoding an input bit sequence (S0) to yield a coded bit sequence (S), said device comprising:
    first coding means (30) for coding the bits of said input bit sequence (S0) using a first code to generate an output bit sequence;
    interleaving means (33) for interleaving bits of the output bit sequence obtained from said first coding means (30); and
    second coding means (32), referred to as parity means for coding bits obtained from said interleaving means (33) using a second code to generate said coded bit sequence (S);
    wherein said interleaving means (33) are such that said parity, second coding means (32) begin said coded bit sequence (S) after a predetermined number $\Delta$ of bits have been interleaved without waiting for the end of interleaving, said predetermined number Δ of bits being less than a first higher number Δs of bits corresponding to the total number of bits to be processed by said interleaving means (33), such that the first higher number Δs of bits is less than or equal to a length of the output bit sequence generated by the first coding means.

28. The device for encoding according to claim 27, wherein said predetermined number Δ of bits is greater than a first lower number Δi of bits which depends on one or more parameters of said interleaving means (33).

29. A device for decoding a receive digitized signal comprising a data sequence formed of a first part D corresponding to information to be transmitted and a second part C including redundant data, said device comprising:

first decoding means (40) for decoding data items of said first part D to generate an output data sequence;

interleaving means (43) for interleaving data of the output data sequence obtained from said first coding means; and second decoding means (42), referred to as parity means, for decoding bits obtained from said interleaving means (43);

wherein said interleaving means (43) are such that said parity, second decoding means (42) begin parity decoding after a predetermined number Δ of data items have been interleaved without waiting for the end of interleaving, said predetermined number Δ of data items being less than a first higher number Δs of data items corresponding to the total number of data items to be processed by said interleaving means (43), such that the first higher number Δs of data items is less than or equal to a length of the output data sequence generated by the first decoding means.

30. The device for decoding according to claim 29, wherein said predetermined number Δ of bits is greater than a first lower number Δi of bits which depends on one or more parameters of said interleaving means (43).

* * * * *